United States Patent
Cheng et al.

(10) Patent No.: US 8,669,802 B2
(45) Date of Patent: Mar. 11, 2014

(54) WIDE RANGE LEVEL SHIFT SYSTEM

(75) Inventors: Yang-Cheng Cheng, Hsinchu Science Park (TW); Chien-Chun Huang, Hsinchu Science Park (TW)

(73) Assignee: Orise Technology Co., Ltd., Hsinchu (TW)

(*) Notice: Subject to any disclaimer, the term of this patent is extended or adjusted under 35 U.S.C. 154(b) by 42 days.

(21) Appl. No.: 13/426,698

(22) Filed: Mar. 22, 2012

(65) Prior Publication Data
US 2012/0313684 A1 Dec. 13, 2012

(30) Foreign Application Priority Data
Jun. 10, 2011 (TW) .................. 100120348 A (51) Int. Cl.
*H03L 5/00* (2006.01)
(52) U.S. Cl.
USPC .............................. 327/333; 327/112; 326/81

(58) Field of Classification Search
USPC ................. 327/112, 333; 326/68, 80, 81; 365/189.11
See application file for complete search history.

(56) References Cited

U.S. PATENT DOCUMENTS

| 6,255,867 B1 * | 7/2001 | Chen .............................. 327/112 |
| 6,346,829 B1 * | 2/2002 | Coddington .................... 326/81 |
| 6,683,486 B2 * | 1/2004 | Hanson et al. ................. 327/333 |

* cited by examiner

*Primary Examiner* — Long Nguyen
(74) *Attorney, Agent, or Firm* — Bacon & Thomas, PLLC (57) ABSTRACT

A wide range level shift system receives an input signal with a first voltage level and a second voltage level. The wide range level shift system transforms the input signal to an output signal with a third voltage level and a fourth voltage level, wherein the first voltage level is smaller than the second voltage level, the second voltage level is smaller than the third voltage level, and the fourth voltage level is smaller than the first voltage level. The wide range level shift system reduces the number of transistors required, the layout area of the transistors, and the power consumption.

9 Claims, 8 Drawing Sheets

WIDE RANGE LEVEL SHIFT SYSTEM

CROSS REFERENCE TO RELATED APPLICATION

This application claims the benefits of the Taiwan Patent Application Serial Number 100120348, filed on Jun. 10, 2011, the subject matter of which is incorporated herein by reference.

BACKGROUND OF THE INVENTION

1. Field of the Invention

The present invention relates to the technical field of voltage level shift and, more particularly, to a wide range level shift system.

2. Description of Related Art

Generally, a voltage level shift circuit is used to transform a control signal with low voltage to a control signal with high voltage. For example, in the liquid crystal display application, it is generally required to transform a digital control signal from 0~3.3 volts to −15~20 volts so as to drive a thin film transistor. Thus, a voltage level shift circuit is used to proceed with voltage level shift.

Figure 1:
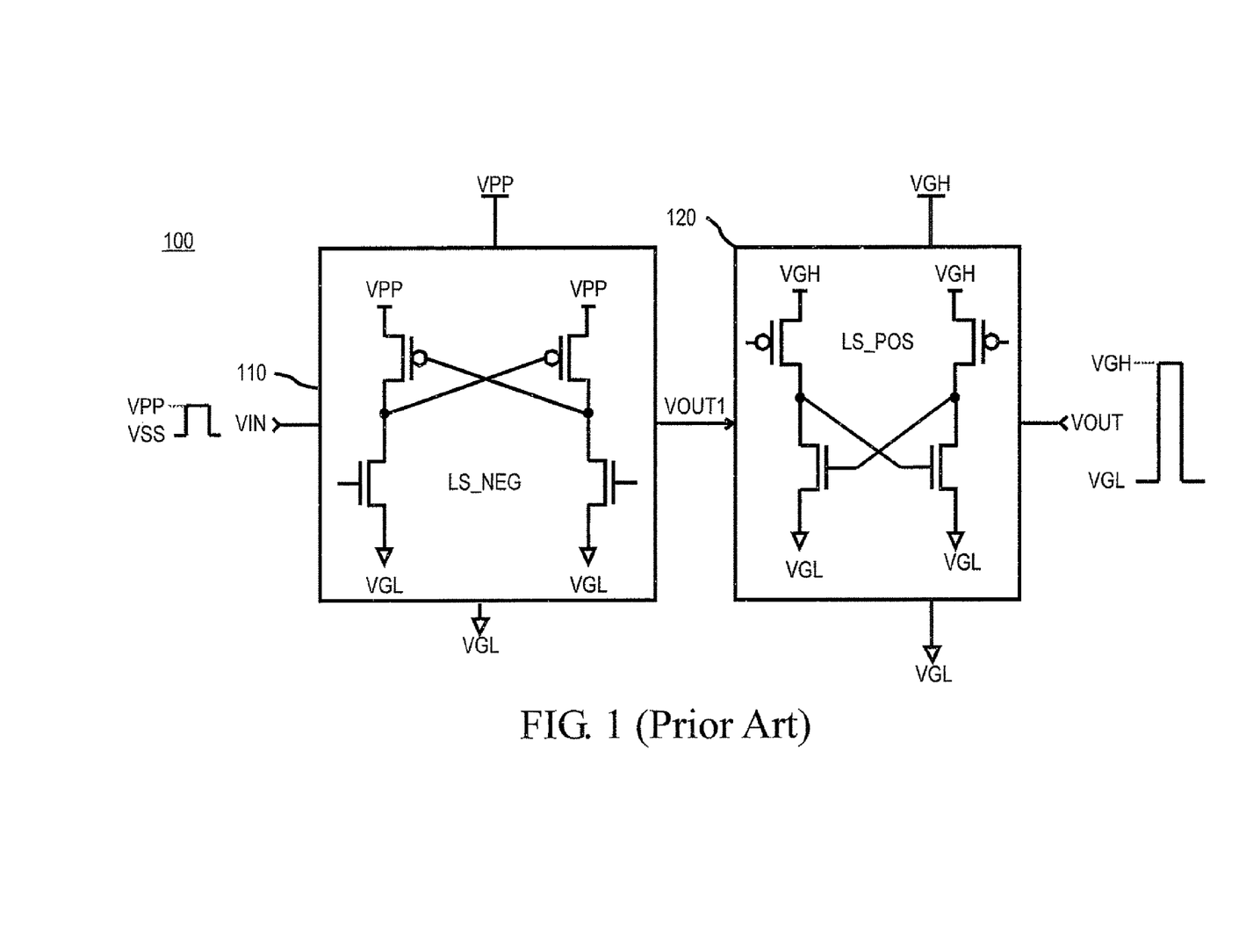
FIG. 1 is a schematic diagram of a conventional voltage level shift circuit.

FIG. 1 is a schematic diagram of a conventional voltage level shift circuit 100, which comprises two voltage level shifters 110, 120. The first voltage level shifter 110 is provided to transform an input signal VIN from the level of VPP to VSS to the level of VPP to VGL, wherein VPP is approximately 3.3 volts, VSS is approximately 0 volt and VGL is approximately −15 volts. That is, the first voltage level shifter 110 maintains the input signal at VPP level first and then negatively transforms the voltage of the input signal VIN to VGL level.

The second voltage level shifter 120 is provided to transform a signal VOUT1 outputted by the first voltage level shifter 110 from the level of VPP to VGL to the level of VGH to VGL, wherein VGH is approximately 20 volts. That is, the second voltage level shifter 120 maintains the output signal at VGL level first and then positively transforms the voltage of VOUT1 to VGH level.

Figure 2:
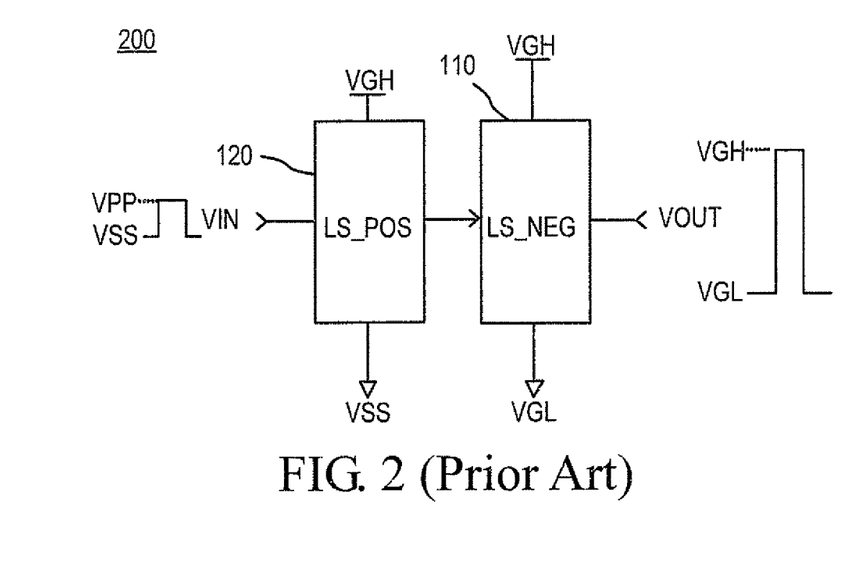
FIG. 2 is a schematic diagram of another conventional voltage level shift circuit.

FIG. 2 is a schematic diagram of another conventional voltage level shift circuit 200, which is different from that of FIG. 1 in transforming the level of an input signal VIN from VPP~VSS to VGH~VSS and then transforming the level from VGH~VSS to VGH~VGL. As can be known from FIG. 1 and FIG. 2, a general voltage level shift circuit 100 requires at least eight transistors.

Figure 3:
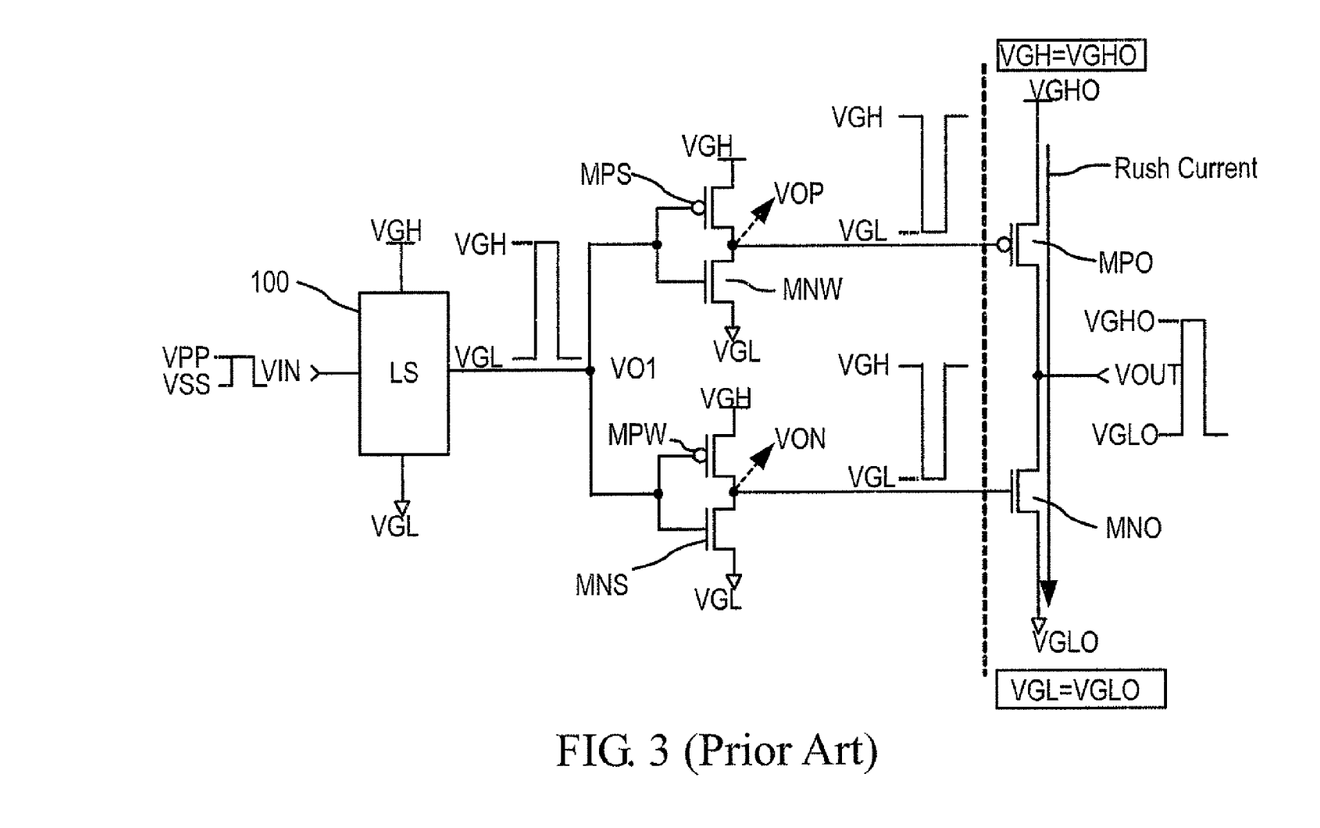
FIG. 3 is a schematic view illustrating an application to the conventional voltage level shift circuit.

FIG. 3 is a schematic view illustrating an application to the conventional voltage level shift circuit 100. In a practical application of the voltage level shift circuit 100, in order to drive a next stage, it typically adds a PMOS transistor MPO and an NMOS transistor MNO for use as an output buffer stage to drive an output load. As input VIN changes the level, the PMOS transistor MPO and the NMOS transistor MNO are turned on at the same time, resulting in occurrence of rush current of VGHO and VGLO. To avoid such a situation, it is required to add two sets of inverter, respectively including a PMOS transistor MPS and an NMOS transistor MNW, and a PMOS transistor MPW and an NMOS transistor MNS. Wherein, a width/length ratio (W/L) of the transistor MPS is bigger and the width/length ratio of the transistor MNW is smaller, while the width/length ratio (W/L) of the transistor MPW is smaller and the width/length ratio of the transistor MNS is bigger.

As the input voltage VIN changes from the VSS level to the VPP level, a voltage VOP and a voltage VON decrease concurrently. Due to that the width/length ratio of the transistor MNS is bigger, the voltage VON decrease faster, resulting in that the transistor MNO is turned off first. Since the width/length ratio of the transistor MNW is smaller, the voltage VOP decrease slower, resulting in that the transistor MPO is turned on later, such that the output voltage VOUT is raised to the VGHO level. Therefore, there will be no such a situation that the transistor MPO and the transistor MNO are turned on at the same time. It can be known from FIG. 1 and FIG. 3 that it needs about twelve transistors for a conventional voltage level shift circuit and two inverters. Accordingly, it not only occupies a lot of size, but also increases much power consumption. Therefore, it is desirable to provide an improved wide range level shift system to mitigate and/or obviate the aforementioned problems.

SUMMARY OF THE INVENTION

The object of the present invention is to provide a wide range level shift system, capable of reducing the number of transistors used and thus reducing the circuit size, while obtaining the optimized power consumption.

In one aspect of the invention, there is provided a wide range level shift system, which comprises: a first NMOS transistor having a gate connected to an input terminal for receiving an input signal, and a source connected to a first voltage level, in which the input signal has the first voltage level and a second voltage level; a first PMOS transistor having a gate connected to the input terminal for receiving the input signal, and a source connected to the second voltage level; a second PMOS transistor having a drain connected to a drain of the first NMOS transistor, and a source connected to a third voltage level; a second NMOS transistor having a drain connected to a drain of the first PMOS transistor, and a source connected to a fourth voltage level; a third PMOS transistor having a gate connected to the drain of the second PMOS transistor, a source connected to the third voltage level, and a drain connected to the gate of the second PMOS transistor; and a third NMOS transistor having a gate connected to the drain of the second NMOS transistor, a source connected to the fourth voltage level, and a drain connected to the gate of the second NMOS transistor and also connected to the drain of the third PMOS transistor for use as an output terminal.

In another aspect of the invention, there is provided a wide range level shift system, which comprises: a first NMOS transistor having a gate connected to an input terminal for receiving an input signal, and a source connected to a first voltage level, in which the input signal has the first voltage level and a second voltage level; a first PMOS transistor having a gate connected to the input terminal for receiving the input signal, and a source connected to the second voltage level; a second PMOS transistor having a drain connected to a drain of the first NMOS transistor, and a source connected to a third voltage level; a second NMOS transistor having a drain connected to a drain of the first PMOS transistor, and a source connected to a fourth voltage level; a third PMOS transistor having a gate connected to the drain of the second PMOS transistor, a source connected to the third voltage level, and a drain connected to the gate of the second PMOS transistor; an impedance circuit having a first terminal connected to the drain of the third PMOS transistor; and a third NMOS transistor having a gate connected to the drain of the second NMOS transistor, a source connected to the fourth voltage level, and a drain connected to the gate of the second PMOS transistor and also connected to a second terminal of the impedance circuit.

DETAILED DESCRIPTION OF THE PREFERRED EMBODIMENT

Figure 4:
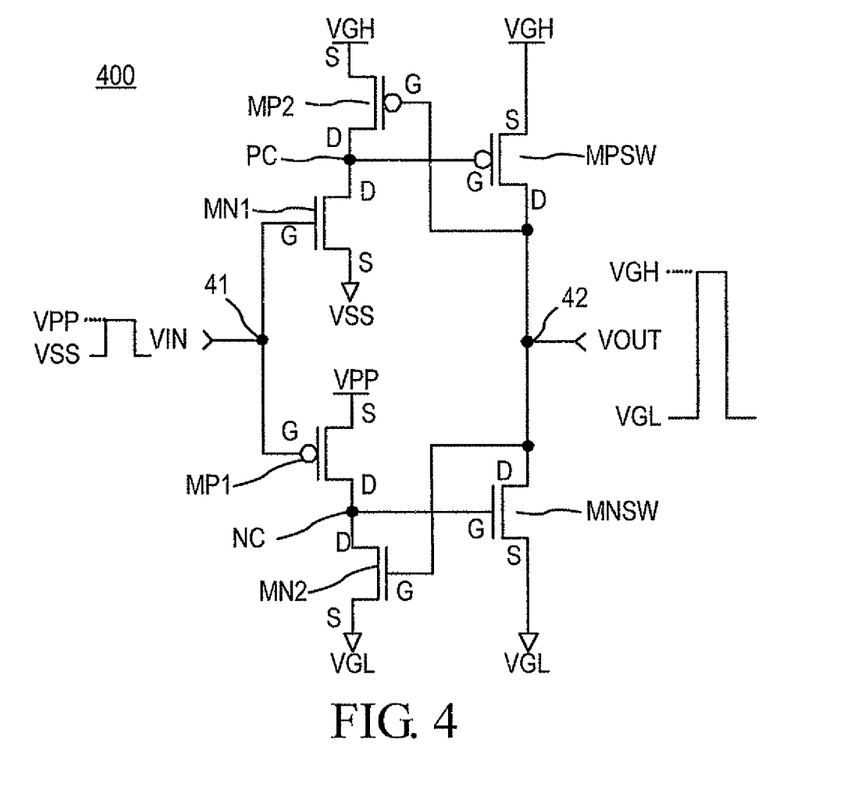
FIG. 4 is a circuit diagram of a wide range level shift system according to a first preferred embodiment of the invention.

With reference to FIG. 4, there is shown a circuit diagram of a wide range level shift system 400 according to a first preferred embodiment of the invention. The wide range level shift system 400 comprises a first NMOS transistor MN1, a first PMOS transistor MP1, a second PMOS transistor MP2, a second NMOS transistor MN2, a third PMOS transistor MPSW and a third NMOS transistor MNSW.

A gate G1 of the first NMOS transistor MN1 is connected to an input terminal 41 for receiving an input signal VIN, and a source S thereof is connected to a first voltage level (VSS), in which the input signal VIN has the first voltage level (VSS) and a second voltage level (VPP).

A gate G of the first PMOS transistor MP1 is connected to the input terminal 41 for receiving the input signal VIN, and a source S thereof is connected to the second voltage level (VPP).

A drain D of the second PMOS transistor MP2 is connected to a drain D of the first NMOS transistor MN1 and a node PC, and a source S of the second PMOS transistor MP2 is connected to a third voltage level (VGH).

A drain D of the second NMOS transistor MN2 is connected to a drain D of the first PMOS transistor MP1 and a node NC, and a source S of the second NMOS transistor MN2 is connected to a fourth voltage level (VGL).

A gate G of the third PMOS transistor MPSW is connected to the drain D of the second PMOS transistor MP2 and the node PC, a source S of the third PMOS transistor MPSW is connected to the third voltage level (VGH), and a drain D of the third PMOS transistor MPSW is connected to the gate G of the second PMOS transistor MP2.

A gate G of the third NMOS transistor MNSW is connected to the drain D of the second NMOS transistor MN2 and the node NC, a source S of the third NMOS transistor MNSW is connected to the fourth voltage level (VGL), and a drain D of the third NMOS transistor MNSW is connected to the gate G of the second NMOS transistor MN2 and is also connected to the drain D of the third PMOS transistor MPSW for use as an output terminal 42.

The first voltage level (VSS) is smaller than the second voltage level (VPP), the second voltage level (VPP) is smaller than the third voltage level (VGH), and the fourth voltage level (VGL) is smaller than the first voltage level (VSS). For example, the first voltage level (VSS) is 0 volt, the second voltage level (VPP) is 2.0 volts, the third voltage level (VGH) is 5.0 volts, and the fourth voltage level (VGL) is −0.5 volts. In other embodiment, the first voltage level (VSS) is 0 volt, the second voltage level (VPP) is 3.3 volts, the third voltage level (VGH) is 20 volts, and the fourth voltage level (VGL) is −15 volts.

The operation theory of the wide range level shift system 400 of the invention is as follows.

(1) As the input signal VIN is shifted from the first voltage level (VSS) to the second voltage level (VPP), the first NMOS transistor MN1 is turned on and the first PMOS transistor MP1 is turned off. Also, the voltage VPC from the drain D of the second PMOS transistor MP2 is lowered gradually to the first voltage level (VSS) so as to simultaneously turn on the third PMOS transistor MPSW. At this moment, the third NMOS transistor MNSW is also turned on. Due to that the voltage VPC at the node PC is gradually lowered to the first voltage level (VSS), the current driving capability of the third PMOS transistor MPSW is stronger, thereby gradually raising the voltage VOUT of the output terminal 42, resulting in turning on of the second NMOS transistor MN2, such that the voltage VNC from the drain D of the second NMOS transistor MN2 is lowered to the fourth voltage level (VGL), thereby turning off the third NMOS transistor MNSW and finally causing the voltage VOUT from the output terminal 42 to be raised to the third voltage level (VGH). As the voltage VOUT from the output terminal 42 is raised to the third voltage level (VGH), the second PMOS transistor MP2 is turned off.

(2) As the input signal VIN is shifted from the second voltage level (VPP) to the first voltage level (VSS), the first NMOS transistor MN1 is turned off and the first PMOS transistor MP1 is turned on, and the voltage VNC from the drain D of the second NMOS transistor MN2 is raised gradually to the second voltage level (VPP) so as to simultaneously turn on the third NMOS transistor MNSW. At this moment, the third PMOS transistor MPSW is also turned on. Due to that the voltage VNC is raised to VPP, the current driving capability of the third NMOS transistor MNSW is stronger, resulting the voltage from the output terminal VOUT to be gradually lowered. The gradually lowering the voltage VOUT from the output terminal 42 results in turning on of the second PMOS transistor MP2, such that the voltage VPC from the drain D of the second PMOS transistor MP2 is raised to the third voltage level (VGH), thereby turning off the third PMOS transistor MPSW, causing the voltage VOUT from the output terminal 42 to be lowered to the fourth voltage level (VGL). As the voltage VOUT from the output terminal 42 is lowered to the fourth voltage level (VGL), the second NMOS transistor MN2 is turned off.

Figure 5:
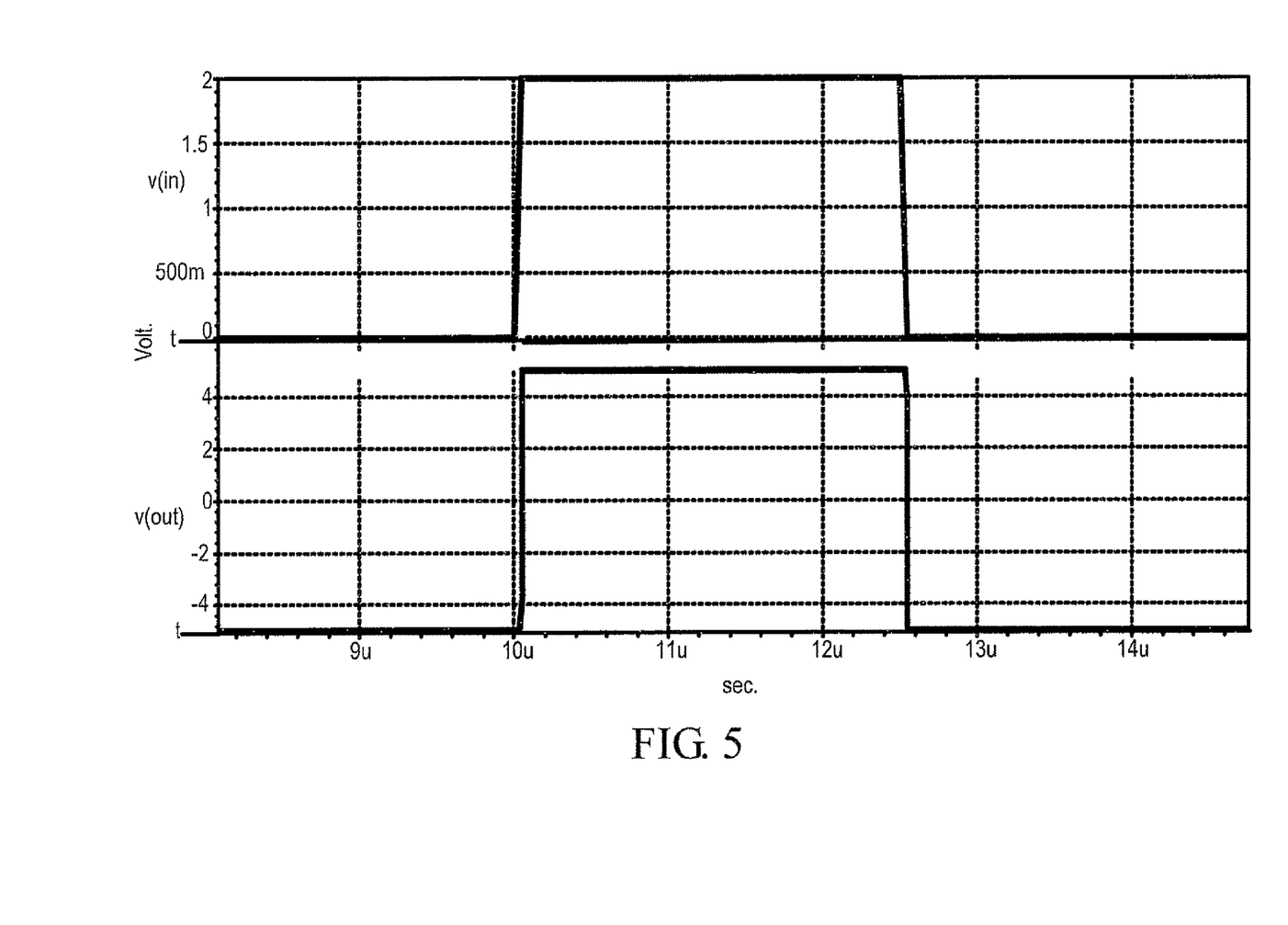
FIG. 5 is a schematic view illustrating a simulation of the wide range level shift system according to the first preferred embodiment of the invention.

FIG. 5 is a schematic view illustrating a simulation of the wide range level shift system 400 according to the first preferred embodiment of the invention. As shown in FIG. 5, the input signal VIN is shifted from 0 volt to 2 volts, and the voltage VOUT of the output terminal 42 is shifted from −5 volts to 5 volts. As the input signal VIN is shifted from 2 volts to 0 volt, the voltage VOUT of the output terminal 42 is shifted from 5 volts to −5 volts.

Figure 6:
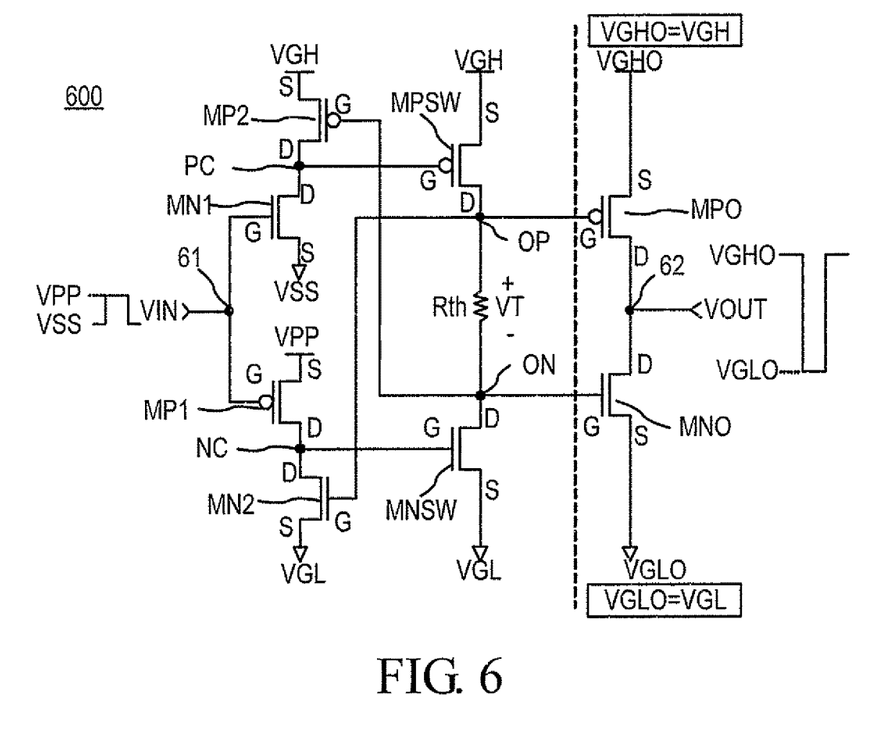
FIG. 6 is a circuit diagram of a wide range level shift system according to a second preferred embodiment of the invention.

FIG. 6 is a circuit diagram of a wide range level shift system 600 according to a second preferred embodiment of the invention. The wide range level shift system 600 comprises a first NMOS transistor MN1, a first PMOS transistor MP1, a second PMOS transistor MP2, a second NMOS transistor MN2, a third PMOS transistor MPSW, an impedance circuit Rth, a third NMOS transistor MNSW, a driving PMOS transistor MPO, and a driving NMOS transistor MNO.

A gate G of the first NMOS transistor MN1 is connected to an input terminal 61 for receiving an input signal VIN, and a source S of the first NMOS transistor MN1 is connected to a first voltage level (VSS), wherein the input signal has the first voltage level (VSS) and a second voltage level (VPP).

A gate G of the first PMOS transistor MP1 is connected to the input terminal 61 for receiving the input signal VIN, and a source S of the first PMOS transistor MP1 is connected to the second voltage level (VPP).

A drain D of the second PMOS transistor MP2 is connected to a drain D of the first NMOS transistor MN1 and a node PC, and a source S of the second PMOS transistor MP2 is connected to a third voltage level (VGH).

A drain D of the second NMOS transistor MN2 is connected to a drain D of the first PMOS transistor MP1 and a node NC, and a source S of the second NMOS transistor MN2 is connected to a fourth voltage level (VGL).

A gate G of the third PMOS transistor MPSW is connected to the drain D of the second PMOS transistor MP2 and the node PC, a source S thereof is connected to the third voltage level (VGH), and a drain D thereof is connected to the gate G of the second NMOS transistor MN2 and a node OP.

A first terminal of the impedance circuit Rth is connected to the drain D of the third PMOS transistor MPSW and the node OP.

A gate G of the third NMOS transistor MNSW is connected to the drain D of the second NMOS transistor MN2 and the node NC, a source S of the third NMOS transistor MNSW is connected to the fourth voltage level (VGL), and a drain D of the third NMOS transistor MNSW is connected to the gate G of the second PMOS transistor MP2 and is also connected to a second terminal of the impedance circuit Rth via a node ON.

A gate G of the driving PMOS transistor MPO is connected to the drain D of the third PMOS transistor MPSW and the node OP, a source S of the driving PMOS transistor MPO is connected to the fifth voltage level (VGHO), and a drain D of the driving PMOS transistor MPO is connected to an output terminal 62.

A gate G of the driving NMOS transistor MNO is connected to the drain D of the third NMOS transistor MNSW and the node ON, a source S of the driving NMOS transistor MNO is connected to a sixth voltage level (VGLO), and a drain D thereof is connected to the output terminal 62.

In this embodiment, the fifth voltage level (VGHO) is equal to the third voltage level (VGH) and the sixth voltage level (VGLO) is equal to the fourth voltage level (VGL).

The operation theory of the wide range level shift system 600 of the invention is as follows.

(1) As the input signal VIN is shifted from the first voltage level (VSS) to the second voltage level (VPP), the voltage VPC from the drain D of the second PMOS transistor MP2 is lowered gradually to the first voltage level (VSS) and the third PMOS transistor MPSW is turned on gradually, resulting in a current flowing through the impedance circuit Rth to cause a voltage drop (VT). At this moment, the voltage VOP from the drain D of the third PMOS transistor MPSW is raised and the voltage VON at the node ON will be lower than the voltage VOP at the node OP by a voltage VT. As VGHO−VOP< |$V_{TH,MPO}$| and VON−VGLO<$V_{TH,MNO}$, the driving PMOS transistor MPO is turned off first and the driving NMOS transistor MNO is maintained at off state, such that the voltage VON from the drain D of the third NMOS transistor MNSW is raised gradually. As VON−VGLO>$V_{TH,MNO}$, the driving NMOS transistor MNO is turned on and the voltage VOUT of the output terminal 62 is the sixth voltage level (VGLO), thereby preventing the driving PMOS transistor MPO and the driving NMOS transistor MNO from being turned on concurrently, and thus avoiding the occurrence of rush current, wherein VGHO is the fifth voltage level, VOP is the voltage from the drain of the third PMOS transistor, $V_{TH,MPO}$ is a threshold voltage of the driving PMOS transistor, VGLO is the sixth voltage level, VON is the voltage from the drain D of the third NMOS transistor MNSW, and $V_{TH,MNO}$ is a threshold voltage of the driving NMOS transistor MNO.

(2) As the input signal VIN is shifted from the second voltage level (VPP) to the first voltage level (VSS), the voltage VNC from the drain D of the second NMOS transistor MN2 is raised gradually to the second voltage level (VPP) and the third NMOS transistor MNSW is turned on gradually, resulting in a current flowing through the impedance circuit Rth to cause a voltage drop (VT). At this moment, the voltage VON from the drain D of the third NMOS transistor MNSW is lowered and the voltage VOP at the node OP is higher than the voltage VON at the node ON by a voltage VT. As VON−VGLO<$V_{TH,MNO}$ and VGHO−VOP<|$V_{TH,MNO}$|, the driving NMOS transistor MNO is turned off and the driving PMOS transistor MPO is maintained at off state, such that the voltage VOP of the drain of the third PMOS transistor MPSW is lowered gradually. As VGHO−VOP>|$T_{TH,MPO}$|, the driving PMOS transistor MPO is turned on and the voltage VOUT from the output terminal 62 is the fifth voltage level (VGHO), thereby preventing the driving PMOS transistor MPO and the driving NMOS transistor MNO from being turned on concurrently.

In the wide range level shift system 600 of this embodiment, the impedance circuit Rth is added, the gate of the second PMOS transistor MP2 is connected to the node ON, and the gate of the second NMOS transistor MN2 is connected to the node OP, so as avoid the rush current.

With the impedance circuit Rth, the reversing ability of the wide range level shift system 600 can be strengthened. This is because when adding the impedance circuit Rth between the node OP and the node ON, it will result in a voltage drop (VT) at the node OP and the node ON. As long as there is current flowing through the impedance circuit Rth, the time of concurrently turning on the third PMOS transistor MPSW and the third NMOS transistor MNSW will be reduced. Further, strengthening the reversing ability of the wide range level shift system 600 of the invention will be strengthend.

(1) As the input signal VIN is shifted from the first voltage level (VSS) to the second voltage level (VPP), the voltage VPC from the drain D of the second PMOS transistor MP2 is lowered gradually to the first voltage level (VSS), the third PMOS transistor MPSW is turned on gradually, and the voltage VOP from the drain D of the third PMOS transistor MPSW is raised, such that the second NMOS transistor MN2 is turned on faster and the voltage VNC from the drain D of the second NMOS transistor MN2 is pulled to the fourth voltage level more quickly, thereby turning off the third NMOS transistor MNSW faster and further raising the voltage VOP from the drain D of the third PMOS transistor MPSW to the third voltage level (VGH) more quickly.

(2) As the input signal VIN is shifted from the second voltage level (VPP) to the first voltage level (VSS), the voltage VNC of the drain D of the second NMOS transistor MN2 is raised gradually to the second voltage level (VPP), the third NMOS transistor NMOS is turned on gradually, the voltage VON of the drain D of the third NMOS transistor MNSW is lowered, such that the second PMOS transistor MP2 is turned on faster and the voltage VPC of the drain D of the second PMOS transistor MP2 is pulled to the third voltage level (VGH), thereby turning off the third PMOS transistor MPSW faster and further lowering the voltage VON from the drain D of the third NMOS transistor MNSW to the fourth voltage level (VGL).

Figure 7:
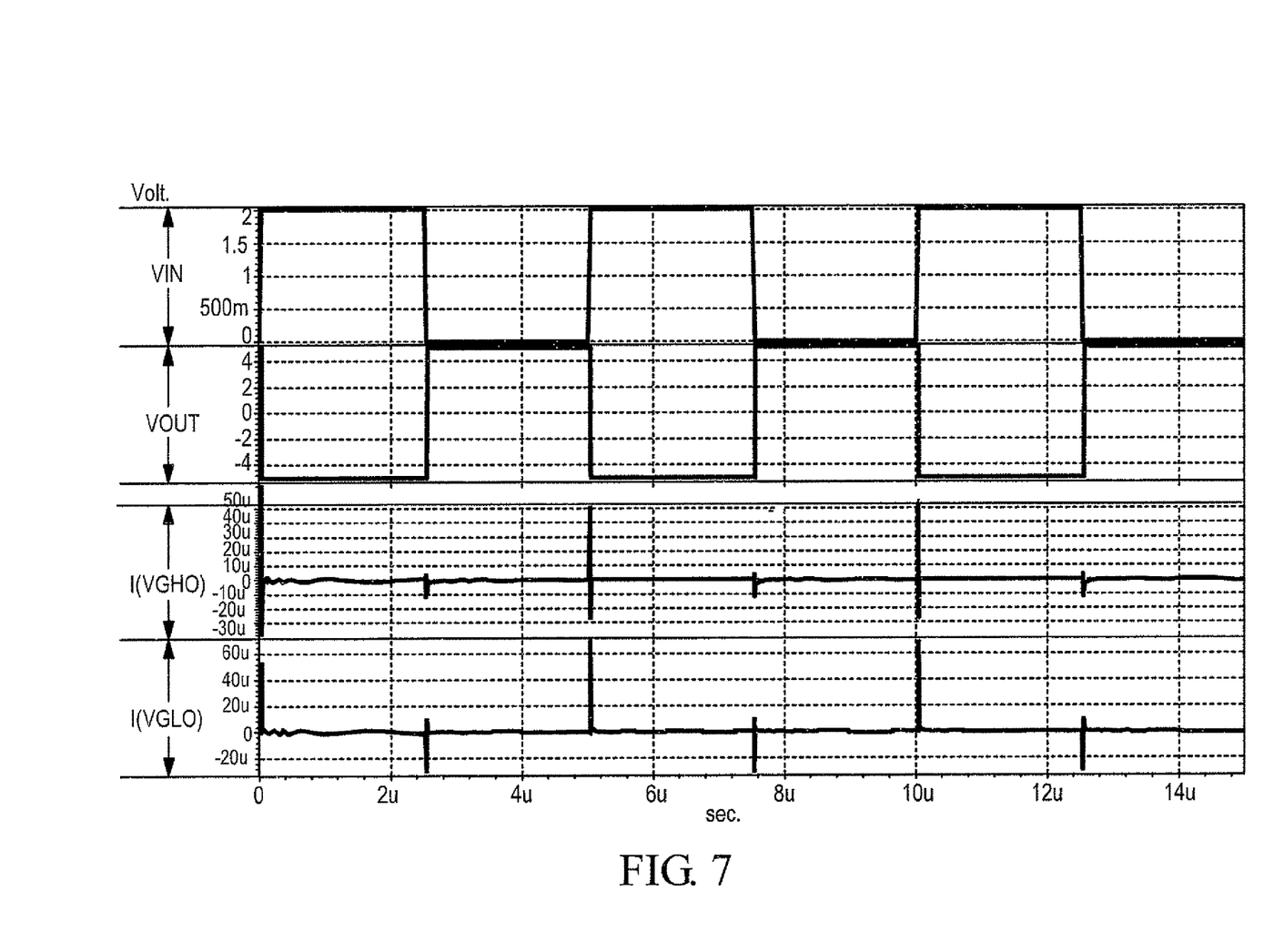
FIG. 7 is a schematic view illustrating a simulation of the wide range level shift system according to the second preferred embodiment of the invention.

FIG. 7 is a schematic view illustrating a simulation of the wide range level shift system according to the second preferred embodiment of the invention. As shown in FIG. 7, as the input signal VIN is shifted from 0 volt to 2 volts, the voltage VOUT from the output terminal 62 is shifted from 5 volts to −5 volts. As the input signal VIN is shifted from 2 volts to 0 volt, the voltage VOUT from the output terminal 62 is shifted from −5 volts to 5 volts.

Figure 8:
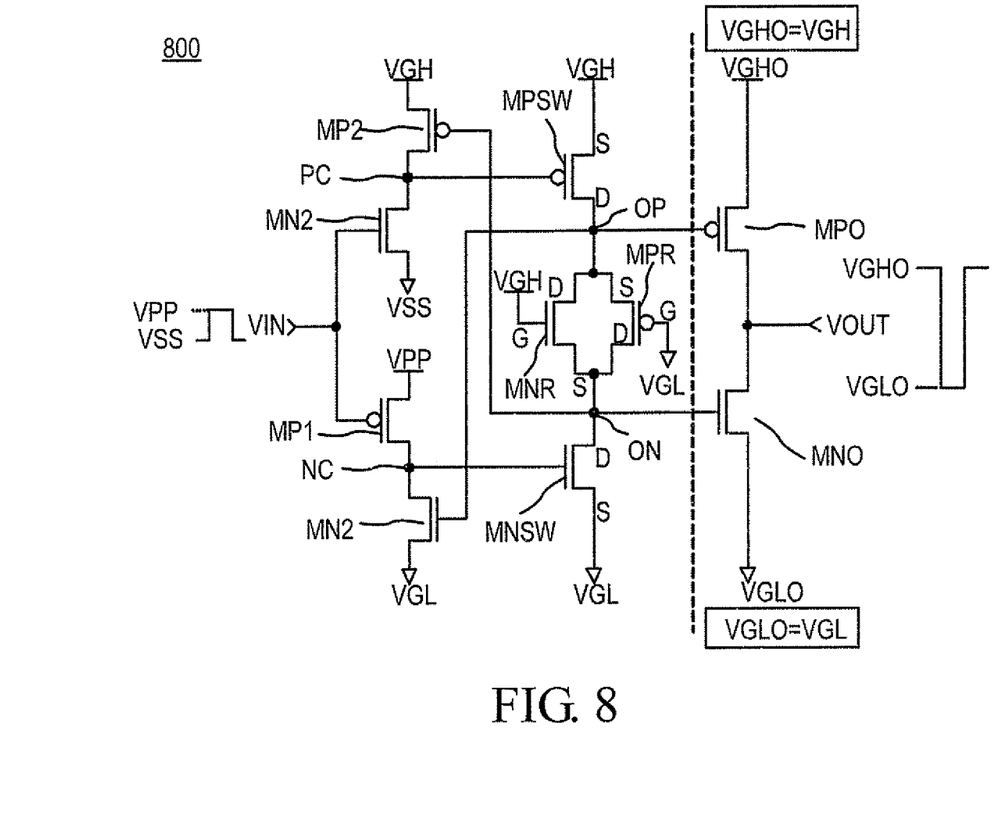
FIG. 8 is a circuit diagram of a wide range level shift system according to a third preferred embodiment of the invention.

In this embodiment shown in FIG. 6, the impedance circuit Rth is a resistor. FIG. 8 is a circuit diagram of a wide range level shift system 800 according to a third preferred embodiment of the invention. In this embodiment, the impedance circuit, as compared with that in FIG. 6, comprises a fourth PMOS transistor MPR and a fourth NMOS transistor MNR. A source S of the fourth PMOS transistor MPR is connected to a drain D of the third PMOS transistor MPSW, a gate G of the fourth PMOS transistor MPR is connected to the fourth voltage level (VGL) and a drain D of the fourth PMOS transistor MPR is connected to the drain D of the third NMOS transistor MNSW. A source S of the fourth NMOS transistor MNR is connected to the drain D of the third NMOS transistor MNSW, a gate G the fourth NMOS transistor MNR is connected to the third voltage level (VGH) and a drain D the fourth NMOS transistor MNR is connected to the drain D of the third PMOS transistor MPSW. In the wide range level shift system 800 of this embodiment, the impedance circuit Rth is replaced with the fourth PMOS transistor MPR and the fourth NMOS transistor MNR connected in parallel. The parallel connection of the fourth PMOS transistor MPR and the fourth NMOS transistor MNR can be deemed as a resistor. Since in a practical layout, the size of a transistor is far smaller than that of a resistor, the wide range level shift system 800 of the invention also provides the advantage of saving the size of chip.

In view of the foregoing, in the procedure of shifting a low voltage signal to a positive or negative high voltage signal, it generally requires a stage of second voltage level shifter 120 for shifting to the positive high voltage signal, and a stage of first voltage level shifter 110 for shifting to the negative high voltage signal, so as to obtain the required positive or negative high voltage level. The wide range level shift system 400 of the invention only needs six MOS transistors for shifting to the required positive or negative high voltage level. Therefore, the invention is able to accomplish the purpose of reducing the number of transistors used, so as to save the size of chip and also reduce power consumption.

Although the present invention has been explained in relation to its preferred embodiment, it is to be understood that many other possible modifications and variations can be made without departing from the spirit and scope of the invention as hereinafter claimed.

What is claimed is:
1. A wide range level shift system, comprising:
a first NMOS transistor, having a gate connected to an input terminal for receiving an input signal, and a source connected to a first voltage level, in which the input signal has the first voltage level and a second voltage level;
a first PMOS transistor, having a gate connected to the input terminal for receiving the input signal, and a source connected to the second voltage level;
a second PMOS transistor, having a drain connected to a drain of the first NMOS transistor, and a source connected to a third voltage level;
a second NMOS transistor, having a drain connected to a drain of the first PMOS transistor, and a source connected to a fourth voltage level;
a third PMOS transistor, having a gate connected to the drain of the second PMOS transistor, a source connected to the third voltage level, and a drain connected to the gate of the second PMOS transistor;
an impedance circuit, having a first terminal connected to the drain of the third PMOS transistor; and
a third NMOS transistor, having a gate connected to the drain of the second NMOS transistor, a source connected to the fourth voltage level, and a drain connected to the gate of the second PMOS transistor and also connected to a second terminal of the impedance circuit.

2. The wide range level shift system as claimed in claim 1, further comprising:
a driving PMOS transistor, having a gate connected to the drain of the third PMOS transistor, a source connected to a fifth voltage level, and a drain connected to an output terminal; and
a driving NMOS transistor, having a gate connected to the drain of the third NMOS transistor, a source connected to a sixth voltage level, and a drain connected to the output terminal.

3. The wide range level shift system as claimed in claim 2, wherein the first voltage level is smaller than the second voltage level, the second voltage level is smaller than the third voltage level, and the fourth voltage level is smaller than the first voltage level.

4. The wide range level shift system as claimed in claim 3, wherein as the input signal is shifted from the first voltage level to the second voltage level, the voltage from the drain of the second PMOS transistor is lowered to the first voltage level so as to turn on the third PMOS transistor, and the voltage from the drain of the third PMOS transistor is raised, in which as VGHO−VOP<|$V_{TH,MPO}$| and VON−VGLO<$V_{TH,MNO}$, the driving PMOS transistor is turned off and the driving NMOS transistor is maintained at off state, such that the voltage from the drain of the third NMOS transistor is raised, and as VON−VGLO>$V_{TH,MNO}$, the driving NMOS transistor is turned on and the voltage from the output terminal is the sixth voltage level, thereby preventing the driving PMOS transistor and the driving NMOS transistor from being turned on concurrently, where VGHO is the fifth voltage level, VOP is the voltage from the drain of the third PMOS transistor, $V_{TH,MPO}$ is a threshold voltage of the driving PMOS transistor, VGLO is the sixth voltage level, VON is the voltage from the drain of the third NMOS transistor, and $V_{TH,MNO}$ is a threshold voltage of the driving NMOS transistor.

5. The wide range level shift system as claimed in claim 4, wherein as the input signal is shifted from the second voltage level to the first voltage level, the voltage from the drain of the second NMOS transistor is raised to the second voltage level so as to turn on the third NMOS transistor, and the voltage from the drain of the third NMOS transistor is lowered, and wherein as VON−VGLO<$V_{TH,MNO}$ and VGHO−VOP< |$V_{TH,MPO}$|, the driving NMOS transistor is turned off and the driving PMOS transistor is maintained at off state, such that the voltage from the drain of the third PMOS transistor is lowered, and as VGHO−VOP>|$V_{TH,MPO}$|, the driving PMOS transistor is turned on and the voltage from the output terminal is the fifth voltage level, thereby preventing the driving PMOS transistor and the driving NMOS transistor from being turned on concurrently.

6. The wide range level shift system as claimed in claim 4, wherein as the input signal is shifted from the first voltage level to the second voltage level, the voltage from the drain of the second PMOS transistor is lowered, the third PMOS transistor is turned on, the voltage of the drain of the third PMOS transistor is raised, such that the second NMOS transistor is turned on, and the voltage of the drain of the second NMOS transistor is pulled to the fourth voltage level, thereby turning off the third NMOS transistor and further raising the voltage from the drain of the third PMOS transistor to the third voltage level.

7. The wide range level shift system as claimed in claim 5, wherein as the input signal is shifted from the second voltage level to the first voltage level, the voltage from the drain of the second NMOS transistor is raised gradually to the second voltage level, the third NMOS transistor is turned on, the voltage from the drain of the third NMOS transistor is lowered, such that the second PMOS transistor is turned on, and the voltage from the drain of the second PMOS transistor is pulled to the third voltage level, thereby turning off the third PMOS transistor and further lowering the voltage from the drain of the third NMOS transistor to the fourth voltage level.

8. The wide range level shift system as claimed in claim 3, wherein the impedance circuit is a resistor.

9. The wide range level shift system as claimed in claim 3, wherein the impedance circuit includes a fourth PMOS transistor and a fourth NMOS transistor, wherein the fourth PMOS transistor has a source connected to the drain of the third PMOS transistor, a gate connected to the fourth voltage level and a drain connected to the drain of the third NMOS transistor, and the fourth NMOS transistor has a source connected to the drain of the third NMOS transistor, a gate connected to the third voltage level and a drain connected to the drain of the third PMOS transistor.

* * * * *